United States Patent
Fu et al.

(10) Patent No.: US 7,138,792 B2
(45) Date of Patent: Nov. 21, 2006

(54) PROGRAMMABLE POWER PERSONALITY CARD

(75) Inventors: Zhenhai Fu, Fremont, CA (US); Syed Hasan Yousuf, Saratoga, CA (US); Philip N. Alex, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 53 days.

(21) Appl. No.: 10/972,892

(22) Filed: Oct. 25, 2004

(65) Prior Publication Data

US 2006/0087309 A1   Apr. 27, 2006

(51) Int. Cl.
    *G01R 31/02*    (2006.01)
    *G01R 31/00*    (2006.01)
    *G06F 1/28*    (2006.01)

(52) U.S. Cl. .................. 324/158.1; 324/763; 324/754; 713/340

(58) Field of Classification Search ................. 324/771
See application file for complete search history.

(56) References Cited

U.S. PATENT DOCUMENTS 5,519,331 A * 5/1996 Cowart et al. ............... 324/755
6,747,473 B1 * 6/2004 Cowan ........................ 324/765
6,791,344 B1 * 9/2004 Cook et al. .................. 324/754
2004/0124829 A1 * 7/2004 Swettlen et al. ........... 324/158.1

* cited by examiner

*Primary Examiner*—Ha Tran Nguyen
*Assistant Examiner*—Emily Y. Chan
(74) *Attorney, Agent, or Firm*—Luedeka, Neely & Graham

(57) ABSTRACT

An apparatus for routing power between a set of power supply taps of an automated tester and power connections on an integrated circuit under test, where the integrated circuit belongs to a family of integrated circuits that have a common power connection layout and different power connection voltage requirements. An interface board having first electrical contacts disposed in the common power connection layout makes electrical connections to the power connections of all integrated circuits belonging to the family of integrated circuits. The first electrical contacts are electrically routed to second electrical contacts disposed in a standardized configuration. A power personality card having third electrical contacts makes electrical connections to the second electrical contacts of the interface board. Fourth electrical contacts are disposed in a standardized configuration, and the third electrical contacts are electrically routed to the fourth electrical contacts via electrical lines that are hard wired for the power connection voltage requirements of the integrated circuit under test. The power personality card and the interface board are interchangeable, one with another. Power supply taps make electrical connections to the fourth electrical contacts and provide power to the fourth electrical contacts.

3 Claims, 3 Drawing Sheets

PROGRAMMABLE POWER PERSONALITY CARD

FIELD

This invention relates to the field of integrated circuit fabrication. More particularly, this invention relates to electrically testing integrated circuits.

BACKGROUND

As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Currently, customized integrated circuits require their own specially configured test hardware. This tends to dramatically increase the cost of the hardware required to test the customized integrated circuits, and also dramatically increases the engineering effort and the cycle time required to accomplished the testing. Even for design families of integrated circuits that use the same package, customized testing hardware is still needed, because each integrated circuit design in the same family has its own configurations in terms of power segment usage, IO buffer type, power level of each power segment, IP usage, and other resource usage.

What is needed, therefore, is a system by which problems such as those described above are overcome, at least in part.

SUMMARY

The above and other needs are met by an apparatus for routing power between a set of power supply taps of an automated tester and power connections on an integrated circuit under test, where the integrated circuit belongs to a family of integrated circuits that have a common power connection layout and different power connection voltage requirements. An interface board having first electrical contacts disposed in the common power connection layout makes electrical connections to the power connections of all integrated circuits belonging to the family of integrated circuits. The first electrical contacts are electrically routed to second electrical contacts disposed in a standardized configuration. A power personality card having third electrical contacts makes electrical connections to the second electrical contacts of the interface board. Fourth electrical contacts are disposed in a standardized configuration, and the third electrical contacts are electrically routed to the fourth electrical contacts via electrical lines that are hard wired for the power connection voltage requirements of the integrated circuit under test. The power personality card and the interface board are interchangeable, one with another. Power supply taps make electrical connections to the fourth electrical contacts and provide power to the fourth electrical contacts.

In this manner, an interface board, such as a probe card for an unpackaged device or a socket for a packaged device, can be constructed in a manner that it can make electrical connections to the standard power connection layout of all of the different integrated circuits within a family of integrated circuits. The interface card then makes connections to the power personality card using a standard connection layout, so that various interface cards can be used with various power personality cards. The power personality card makes connections to the power supply from an automated tester, which connections are also made in a standardized configuration, so that many different power personality cards can be used to make those connections.

However, the power personality card configures the routing of the power as required by the integrated circuit under test. In one embodiment, the power personality card is hard wired between the third and fourth contacts, to deliver the power as required by the device under test.

In an alternate embodiment, the wiring of the power personality card is reconfigurable, so that it can be set up for a variety of different voltage requirements of the integrated circuits within the family. The reconfiguration of the power personality card in this embodiment can be accomplished either manually, such as by changing wires between pin-outs, or electronically, such as by programming the device with a computer. Thus, a common interface card, and common connections to the automated test equipment, can be used, and the power personality card is used to configure the system to the specific needs of the device under test. This reduces the number and cost of customized fixtures that are needed for testing a variety of different integrated circuits.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

A general overview of the invention is first provided herein, and then a more detailed description is given hereafter. The preferred embodiments of the present invention have two general parts, being (1) an automated test equipment test hardware scheme based on a power personality card, and (2) an automatic diagnostic of the test hardware setup.

As to the first part, this invention enables the use of the same load board, probe interface board, or probe card for different integrated circuit designs from a common design family. Signal routing is the same as conventional custom hardware. For power configuration, an interface such as a pogo tower is used to bring the tester power supplies and package power planes and segments from the load board to the power personality card. The power supply assignment is configured to each package power plane on the power personality card for each design. As to the second part, special test circuitry is used to verify the power supply.

The various embodiments of the present invention have the following features. The load board is preferably the same for each design family, so that each integrated circuit design within a given design family can use a common load board. The probe card interface board is preferably the same for all design families. A blank power personality card and its interface with the load board is the same for all design families and all test platforms. The configuration of the power personality card is unique for each integrated circuit design. Automatic diagnostic test circuitry and programming are used to ensure the correct setup for each configuration.

The embodiments of the present invention thus provide several advantages, including significant cost reduction that is attainted by sharing load boards, probe card interface boards, a generic power personality card, and probe cards. In addition, less effort is expended on hardware debugging, and hardware cycle time is reduced. The invention provides the flexibility to assign any power supply to any power plane as desired for the design requirement. The power personality card allows for personalized power plane grouping per design. The power personality card additionally supports the ganging of multiple tester power supplies to a power segment per design. The diagnostic circuit uses a reduced number of components to reduce board space usage and layer count. The automatic diagnostic test preferably shares one test channel with the non-critical device under test test mode pin. Additionally, the automatic diagnostic test is able to report all faulty circuitry.

Figure 1:
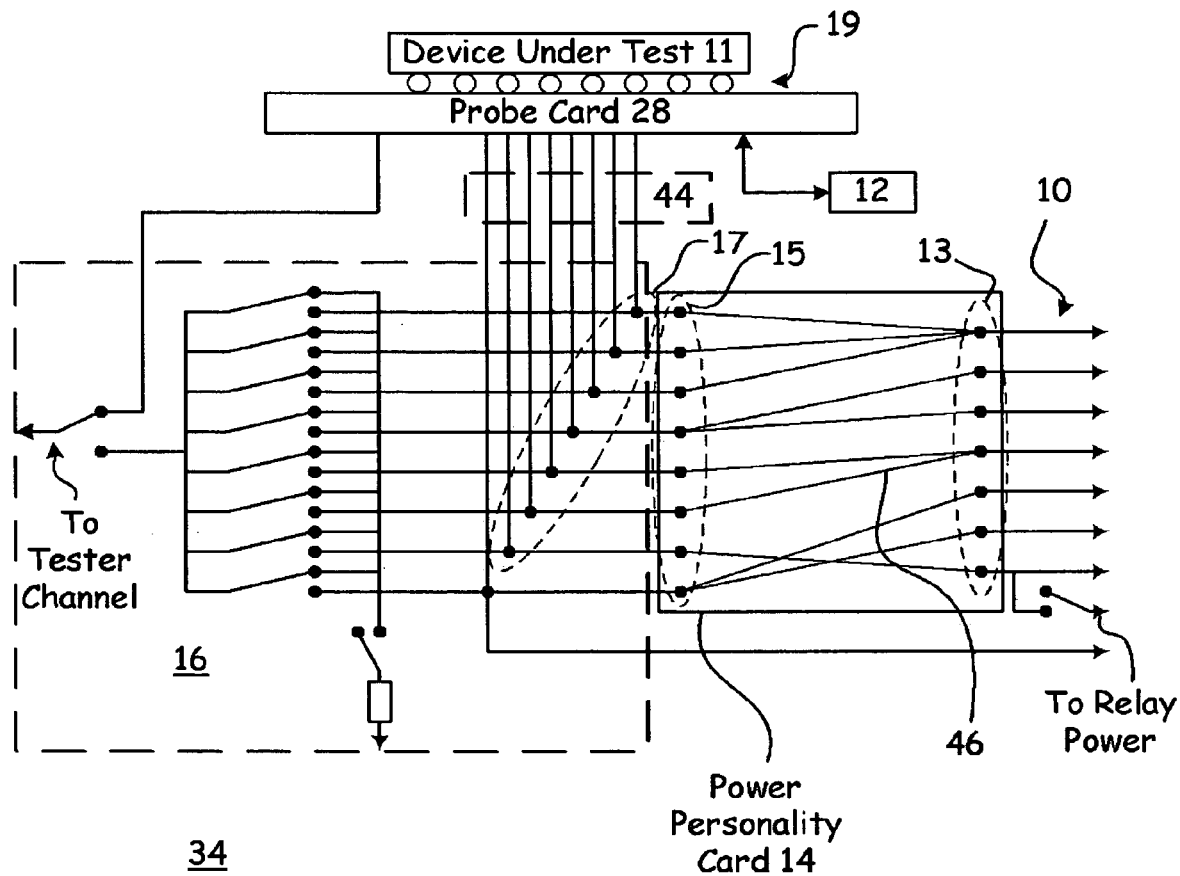
FIG. 1 is a functional block diagram of a portion of a load board/probe interface board, including a power personality card according to a preferred embodiment of the present invention.
Figure 2:
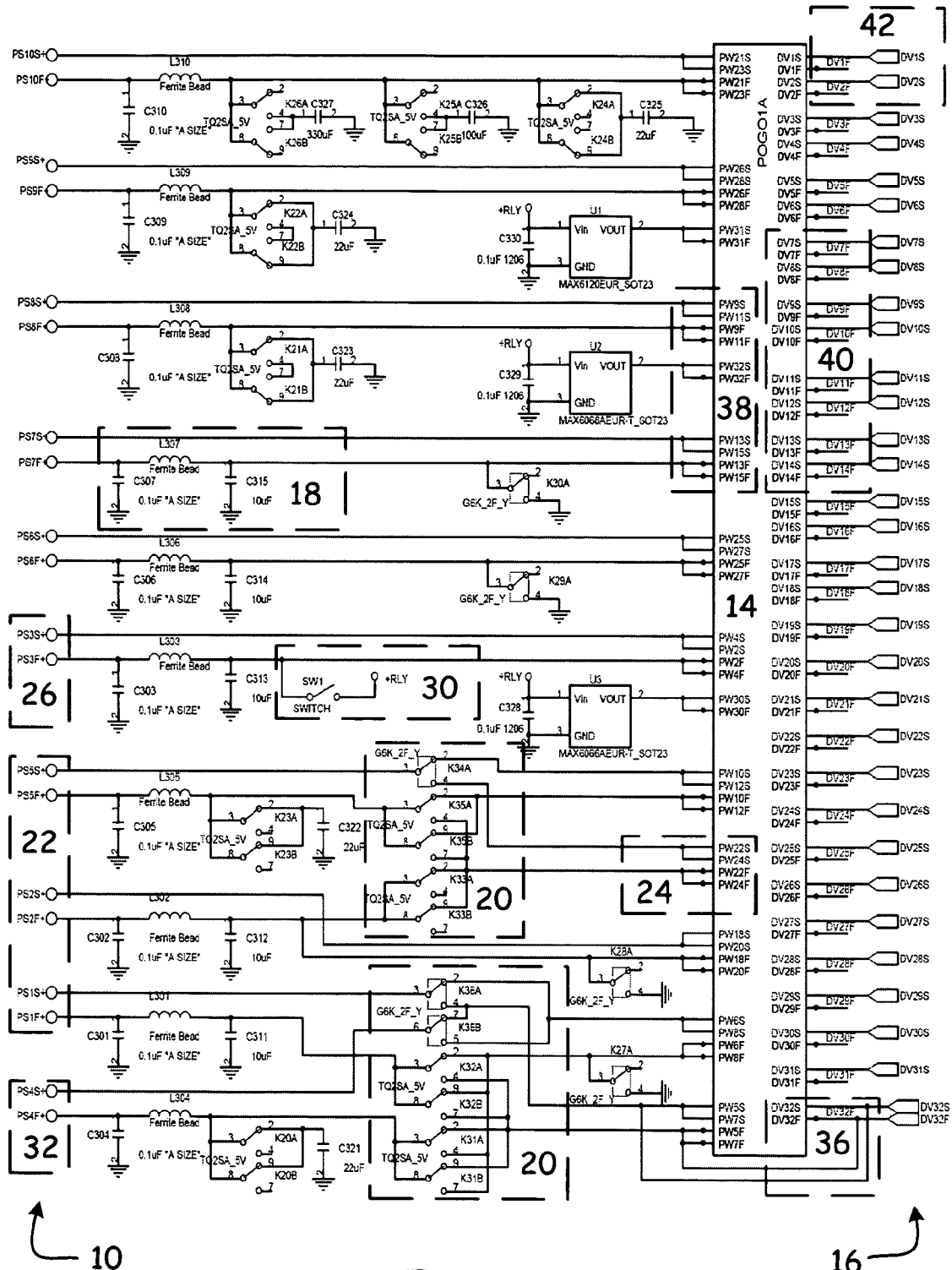
FIG. 2 is a functional schematic of a load board/probe interface board depicting additional detail of the filtering, bypassing, and sharing circuitry.

The overall schematic as depicted in FIG. 1 depicts four basic blocks of the load board 34. The first block is the filtering/bypassing/sharing circuitry 10 for the power supply 22 (not depicted), which circuitry 10 is depicted in greater detail in FIG. 2. The second block is the circuit 12 for diffused IP/IO. In the case of wafer sort, the circuit 12 is preferably disposed on the probe card 28. The third block is the power personality card 14. The power personality card 14 preferably has thirty-two taps 13 (fourth electrical contacts in the claims) to the tester power supply. Only seven such taps 13 are drawn on the right side of the power personality care 14 as depicted in FIG. 1, 50 as to not unduly encumber the drawing. FIG. 2 depicts all thirty-two taps. It is appreciated that in other embodiments, a greater or lesser number of taps 13 could be specified, depending upon the specific needs of the class of device 11 being tested.

The power personality card 14 preferably also has thirty-two device voltage group taps 15 (third electrical contacts in the claims) to the device power segments. Again, only eight of these taps 15 are drawn on the left side of the power personality card 14 as depicted in FIG. 1, so as to not unduly encumber the drawing. All thirty-two device voltage group taps are depicted in FIG. 2. It is appreciated that in other embodiments, a greater or lesser number of taps 15 could be specified, depending upon the specific needs of the class of device 11 being tested. The power personality card 14 also has a design specific set of cross connections 46 between the power supply taps 13 on the right and the device voltage group taps 15 on the left. The specific connections depicted in FIG. 1 are by way of example only, and are not intended to be a limitation on the manner in which the power supply taps 13 and the device voltage group taps 15 can be connected, one to another.

Figure 3:
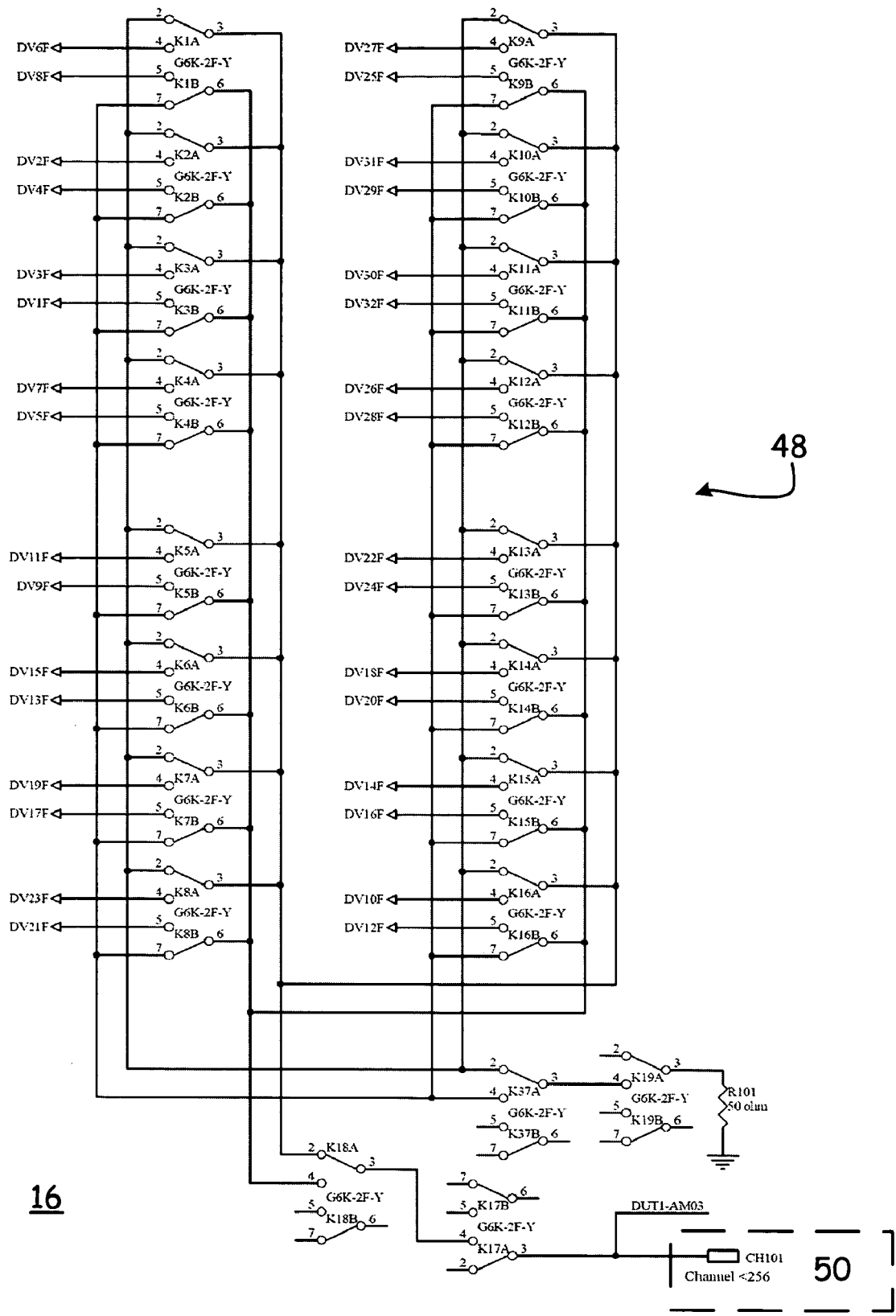
FIG. 3 is a functional schematic of test circuitry for self-diagnostics of automated test equipment.

The fourth block is the relay matrix diagnostic circuit 16, which is shown in detail in FIG. 3.

The power supply filtering, bypassing, and sharing circuitry 10 is preferably similar for all tester platforms. FIG. 2 is just an example for one tester platform. Each power supply preferably has an LC filter circuit 18 associated with it. A relay circuit 20 is preferably added so as to switch between different power supplies 22 for power supply ganging and IDD/IDDQ measurement. The extra power supply 24 can be powered up by different power supplies 22 at functional test and direct current test, to manage the automated test equipment power supply limitation.

One power supply 26 is preferably used as a relay power and input to the voltage regulators for testers without a dedicated relay power supply. However, if there is no need to switch any relays during device test, and the rest of the power supplies 22 are not sufficient for a particular design, this power supply 26 can also be used to power up the device under test 28. In the preferred embodiment, this requires the mechanical switch 30 to be turned off.

Another power supply 32 is routed on the load board 34 to the device core without going through the power personality card 14. Concurrently, the device core power segment 36 is also brought up to the power personality card 14 for ganging with other power supplies 22. Each of the rest of the power supplies 22 are brought to the power supply 38 on the power personality card 14 though connectors 40. Both sense and force of each power supply 22 are preferably brought to the power personality card 14.

Each device power segment is preferably brought to the device voltage group 40 of the power personality card 14 through the sense and force lines 42. Only one sense point is preferably used for each power segment. Sense and force lines of each power segment are preferably shorted at only one point 44, as close to the device under test 28 as possible. Each type of analog IP preferably has its dedicated power supply 22.

In each design, preferably depending at least in part on the resources used on the slice and the 10 power configuration, interconnects 46 are made on the power personality card 14 to personalize each design. If multiple power supplies 22 are ganged to power up one device voltage group 40, each power supply 22 should have its sense/force line 42 connected to the sense/force line of the same device voltage group 40. If one power supply 22 is used for multiple device power segments, preferably only one sense line from the device voltage groups 40 sharing the same power supply 22 is connected to the PW sense line.

Each device voltage group 40 on the power personality card 14 is preferably brought down to the load board 34 (connecting to taps 17 as depicted in FIG. 1, which are the second electrical contacts in the claims) and then is preferably routed to both the device 11 (connecting to taps 19 as depicted in FIG. 1, which are the first electrical contacts in the claims) 28 and the relay matrix 48 (K1–K16 on FIG. 3) for diagnostic purposes. Only one tester channel 50 used for a non-critical test mode pin is preferably used for the diagnosis. During diagnosis, K17 is preferably closed to connect the tester channel 50 to one specific device voltage group 40, when one relay from K1 to K16 is closed. K18 is preferably used to select one device voltage group 40 from the two device voltage groups 40 connected to the same relay from K1 to K16. Four relays (K27–30) are preferably added to short one power supply 38 from each interface block to ground, in order to accomplish the power personality card 14 to load board 34 contact resistance measurement.

The diagnostic test function is preferably run with an open socket when the test program is loaded. It is preferably not run for each device test. The diagnostic test consists of (1) power supply short test, to check the test hardware itself, and not the device under test, and (2) relays and other components test, to check the functionality of the relays and external components on the board. As for the power supply to device power segment connection test, this test preferably ensures that the correct cross connections between the power supplies and the device power segments have been made, and measures the resistance of the power path, including the contact resistance.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An apparatus for routing power between a set of power supply taps of an automated tester and power connections on an integrated circuit under test that belongs to a family of integrated circuits having a common power connection layout and different power connection voltage requirements, the apparatus comprising:

an interface board having first electrical contacts disposed in the common power connection layout and adapted to make electrical connections to the power connections of all integrated circuits belonging to the family of integrated circuits, the first electrical contacts electrically routed to second electrical contacts disposed in a standardized configuration, a power personality card having third electrical contacts adapted to make electrical connections to the second electrical contacts of the interface board, and fourth electrical contacts disposed in a standardized configuration, the third electrical contacts electrically routed to the fourth electrical contacts via electrical lines that are hard wired for the power connection voltage requirements of the integrated circuit under test, automatic diagnostic test circuitry to ensure correct setup of the apparatus, and power supply taps adapted to make electrical connections to the fourth electrical contacts and provide power to the fourth electrical contacts.

2. An apparatus for routing power between a set of power supply taps of an automated tester and power connections on an integrated circuit under test that belongs to a family of integrated circuits having a common power connection layout and different power connection voltage requirements, the apparatus comprising:

an interface board having first electrical contacts disposed in the common power connection layout and adapted to make electrical connections to the power connections of all integrated circuits belonging to the family of integrated circuits, the first electrical contacts electrically routed to second electrical contacts disposed in a standardized configuration, a power personality card having third electrical contacts adapted to make electrical connections to the second electrical contacts of the interface board, and fourth electrical contacts disposed in a standardized configuration, the third electrical contacts electrically routed to the fourth electrical contacts via electrical lines that are selectively manually reroutable based on the power connection voltage requirements of the integrated circuit under test, automatic diagnostic test circuitry to ensure correct setup of the apparatus, and power supply taps adapted to make electrical connections to the fourth electrical contacts and provide power to the fourth electrical contacts.

3. An apparatus for routing power between a set of power supply taps of an automated tester and power connections on an integrated circuit under test that belongs to a family of integrated circuits having a common power connection layout and different power connection voltage requirements, the apparatus comprising:

an interface board having first electrical contacts disposed in the common power connection layout and adapted to make electrical connections to the power connections of all integrated circuits belonging to the family of integrated circuits, the first electrical contacts electrically routed to second electrical contacts disposed in a standardized configuration, a power personality card having third electrical contacts adapted to make electrical connections to the second electrical contacts of the interface board, and fourth electrical contacts disposed in a standardized configuration, the third electrical contacts electrically routed to the fourth electrical contacts via electrical lines that are selectively electronically reroutable based on the power connection voltage requirements of the integrated circuit under test, automatic diagnostic test circuitry to ensure correct setup of the apparatus, and power supply taps adapted to make electrical connections to the fourth electrical contacts and provide power to the fourth electrical contacts.

* * * * *